(12) United States Patent
Ishimura et al.

(10) Patent No.: US 7,928,472 B2
(45) Date of Patent: Apr. 19, 2011

(54) OPTICAL SEMICONDUCTOR DEVICE WITH A DISTRIBUTED BRAGG REFLECTOR LAYER

(75) Inventors: Eitaro Ishimura, Tokyo (JP);
Masaharu Nakaji, Tokyo (JP); Eiji Yagyu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 236 days.

(21) Appl. No.: 12/252,621

(22) Filed: Oct. 16, 2008

(65) Prior Publication Data

US 2009/0289316 A1 Nov. 26, 2009

(30) Foreign Application Priority Data

May 26, 2008 (JP) ................................. 2008-136918

(51) Int. Cl.
*H01S 5/00* (2006.01)
(52) U.S. Cl. ..................... 257/186; 372/45.01
(58) Field of Classification Search .................. 257/186; 372/45.01, 50.11, 50.124, 96
See application file for complete search history.

(56) References Cited

U.S. PATENT DOCUMENTS

| | | | |
|---|---|---|---|
| 4,982,255 A * | 1/1991 | Tomita | 257/21 |
| 5,212,703 A * | 5/1993 | Kahen | 372/50.11 |
| 2005/0230706 A1* | 10/2005 | Yagyu et al. | 257/186 |
| 2007/0297484 A1 | 12/2007 | Mochizuki | |

FOREIGN PATENT DOCUMENTS

| | | |
|---|---|---|
| JP | 5-283808 | 10/1993 |
| JP | 2005-19599 | 1/2005 |
| JP | 2005-354061 | 12/2005 |
| JP | 2008-28421 | 2/2008 |

OTHER PUBLICATIONS

E. Yagyu, E. Ishimura, M. Nakaji, T. Aoyagi, and Y. Tokuda, "Simple planar structure for high-performance AlInAs avalanche photodiodes," IEEE Photon. Technol. Lett., vol. 18, No. 1, pp. 76-78, Jan. 2006.*
E. Ishimura, et al., "Record High-Efficient Top Illuminated InGaAs Pin Photodiodes with 20GHz-Bandwidth", Proceeding of 21st European Conference of Optical Communication (ECOC), Brussels, Belgium, paper TH. L39, vol. 3, 1995, pp. 1079-1082.

* cited by examiner

*Primary Examiner* — Thomas L Dickey
(74) *Attorney, Agent, or Firm* — Oblon, Spivak, McClelland, Maier & Neustadt, L.L.P.

(57) ABSTRACT

An optical semiconductor device comprises a distributed Bragg reflector layer of a first conductivity type, an optical absorption layer, and a semiconductor layer of a second conductivity type, sequentially formed on a semiconductor substrate; wherein said Bragg reflection layer of the first conductivity type has first semiconductor layers having a band gap wavelength larger than the wavelength of incident light, and second semiconductor layers having a band gap wavelength smaller than the wavelength of incident light; and an optical layer thickness of each of said first semiconductor layers is larger than the optical layer thickness of each of said second semiconductor layers.

8 Claims, 10 Drawing Sheets

OPTICAL SEMICONDUCTOR DEVICE WITH A DISTRIBUTED BRAGG REFLECTOR LAYER

BACKGROUND OF THE INVENTION

1. Field of the Invention

The present invention relates to an optical semiconductor device having a distributed Bragg reflector layer; specifically to an optical semiconductor device having a favorable linearity of response and high quantum efficiency.

2. Background Art

A photodiode having a distributed Bragg reflector (DBR) layer between an optical absorption layer and a semiconductor substrate has been proposed. Transmitted light not absorbed in the optical absorption layer is reflected by the DBR layer, and is absorbed again in the optical absorption layer. Thereby, high quantum efficiency is obtained in a photodiode having a DBR layer.

In certain applications, optical signals transmitted through optical fibers are subjected to photoelectric conversion by a photodiode to convert into electrical signals, and are released as they are as electric waves without involving an amplifier of electricity. In this case, the photodiode must not be destroyed even if extremely strong light enters, and must response with favorable linearity. To improve the linearity of response, the heat dissipation of the photodiode must be improved to suppress the temperature elevation in the vicinity of the optical absorption layer. This is because if the temperature of the optical absorption layer is elevated, the transfer rate of electrons and holes generated by light absorption is lowered, the electrons and holes retaining in the optical absorption layer block electric field in the optical absorption layer (space-charge effect), and no current flows.

However, a tertiary mixed crystal semiconductor such as AlInAs and a quaternary mixed crystal semiconductor such as InGaAsP, which are materials for composing the DBR layer, have nearly ten-fold higher thermal resistance than binary mixed crystal semiconductor such as InP and GaAs, which are materials for composing the semiconductor substrate. Therefore, a photodiode having a DBR layer has a problem wherein heat generated in the optical absorption layer is difficult to dissipate in the semiconductor substrate.

Such a problem of the dissipation of the DBR layer is markedly observed in a vertical-cavity surface-emitting laser (VCSEL), which is a light-emitting element sensitive to temperature elevation. As a countermeasure for such a problem, there have been disclosed methods wherein among the two-layer pair of DBR layers, a tertiary mixed crystal semiconductor layer or a quaternary mixed crystal semiconductor layer having a high thermal resistance is thinned, and a layer having a low thermal resistance is thickened (for example, refer to Japanese Patent Application Laid-Open No. 5-283808, Japanese Patent Application Laid-Open No. 2005-354061 and Japanese Patent Application Laid-Open No. 2005-19599).

SUMMARY OF THE INVENTION

However, if the layer having a high thermal resistance is thinned and the layer having a low thermal resistance is thickened in the DBR layer of a two-layer pair, problems, wherein the reflectance of the DBR layer is lowered and the quantum efficiency of the optical semiconductor device is lowered, are caused.

To solve the above-described problems, an object of the present invention is to provide an optical semiconductor device having a favorable linearity of response and high quantum efficiency.

According to one aspect of the present invention, an optical semiconductor device comprises a distributed Bragg reflector layer of a first conductivity type, an optical absorption layer, and a semiconductor layer of a second conductivity type, sequentially formed on a semiconductor substrate; wherein said Bragg reflection layer of the first conductivity type has first semiconductor layers having a band gap wavelength larger than the wavelength of incident light, and second semiconductor layers having a band gap wavelength smaller than the wavelength of incident light; and an optical layer thickness of each of said first semiconductor layers is larger than the optical layer thickness of each of said second semiconductor layers.

According to the present invention, an optical semiconductor device having a favorable linearity of response and high quantum efficiency can be obtained.

Other and further objects, features and advantages of the invention will appear more fully from the following description.

DETAILED DESCRIPTION OF THE PREFERRED EMBODIMENTS

First Embodiment

Figure 1:
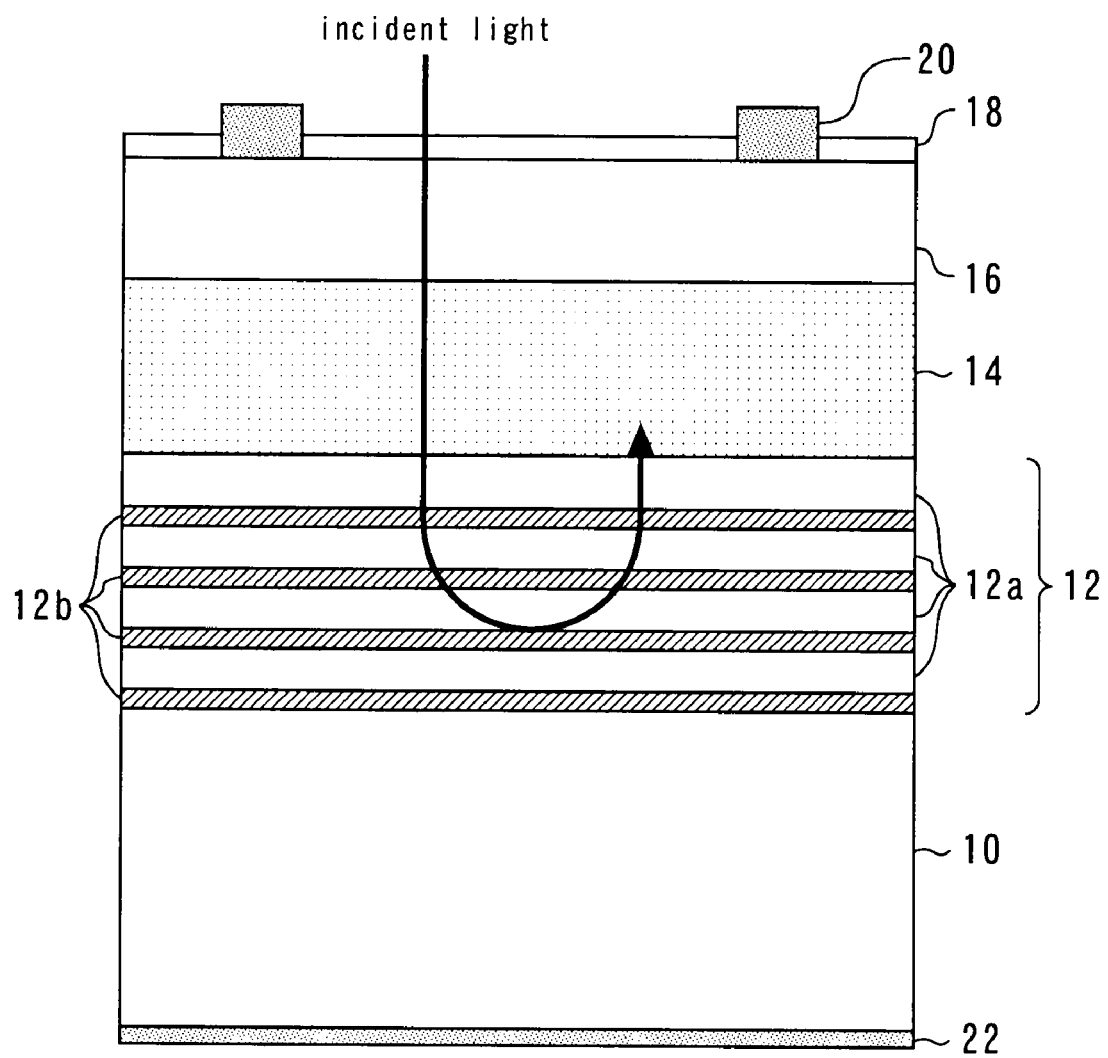
FIG. 1 is a sectional view showing an optical semiconductor device according to a first embodiment of the present invention.

FIG. 1 is a sectional view showing an optical semiconductor device according to a first embodiment of the present invention. The semiconductor device is a photodiode having a distributed Bragg reflector layer.

On an n-type InP substrate 10 (semiconductor substrate), an n-type DBR layer 12 (distributed Bragg reflector layer of a first conductivity type), an i-InGaAs optical absorption layer 14 (optical absorption layer) having a low carrier concentration, and a p-type InP window layer 16 (semiconductor layer of a second conductivity type) are sequentially formed. On the p-type InP window layer 16, an insulating film 18 composed of SiN or the like combining a reflection preventing film and a surface protecting layer, and an anode (p-type) 20 are formed. On the lower surface of the n-type InP substrate 10, a cathode (n-type) 22 is formed.

The n-type DBR layer 12 is composed of alternately laminated n-type InP layers 12a having a low refractive index (first semiconductor layers) and n-type InGaAs layers 12b having a high refractive index (second semiconductor layers). Each of the n-type InP layers 12a has a band gap wavelength smaller than the wavelength λ of incident light, and does not absorb incident light. On the other hand, each of the n-type InGaAs layers 12b has a band gap wavelength larger than the wavelength λ of incident light, and absorbs incident light.

The sum of the optical layer thickness (=layer thickness× refractive index) of a layer of the n-type InP layers 12a and the optical layer thickness of a layer of the n-type InGaAs layers 12b is half the wavelength of incident light λ (=λ/2). Therefore, the n-type DBR layer 12 efficiently operates as a reflecting layer for the incident light having a wavelength λ.

In the present embodiment, the optical layer thickness of each n-type InP layer 12a is larger than the optical layer thickness of each n-type InGaAs layer 12b. For example, the value of the optical layer thickness of an InP layer divided by the optical layer thickness of an InGaAs layer is about 2.2. The effect of the configuration will be described later in detail.

The operation of the optical semiconductor device according to the present embodiment will be described. A reverse bias of 0.5 to 3 V is applied so that the potential of the anode 20 is lower than the potential of the cathode 22. The incident light enters into the i-InGaAs optical absorption layer 14 from the upper side of FIG. 1 through the insulating film 18 and the p-type InP window layer 16. Then, the incident light is absorbed in the i-InGaAs optical absorption layer 14.

The fraction of the incident light absorbed in the i-InGaAs optical absorption layer 14 (=quantum efficiency) is represented by the following equation (1):

$$1-\exp(-\alpha \cdot t) \quad (1)$$

where t is the thickness of the i-InGaAs optical absorption layer 14 and α is the absorption coefficient for the incident light of the -InGaAs optical absorption layer 14.

The light transmitted through the i-InGaAs optical absorption layer 14 without being absorbed in the i-InGaAs optical absorption layer 14 is reflected by the n-type DBR layer 12, and is absorbed again in the i-InGaAs optical absorption layer 14. The quantum efficiency taking return light into account is represented by the following equation (2):

$$1-\exp(-\alpha \cdot t)+R \cdot \exp(-\alpha \cdot t) \cdot (1-\exp(-\alpha \cdot t)) \quad (2)$$

where R is the reflectance of light in the n-type DBR layer 12.

Difference between the equations (1) and (2) is an increment in quantum efficiency by the n-type DBR layer 12. The i-InGaAs optical absorption layer 14 is depleted by the reverse bias. An electric field is applied into the depletion layer, electrons and holes flow in the cathode 22 and the anode 20, respectively, and are taken out as an electric current.

Figure 2:
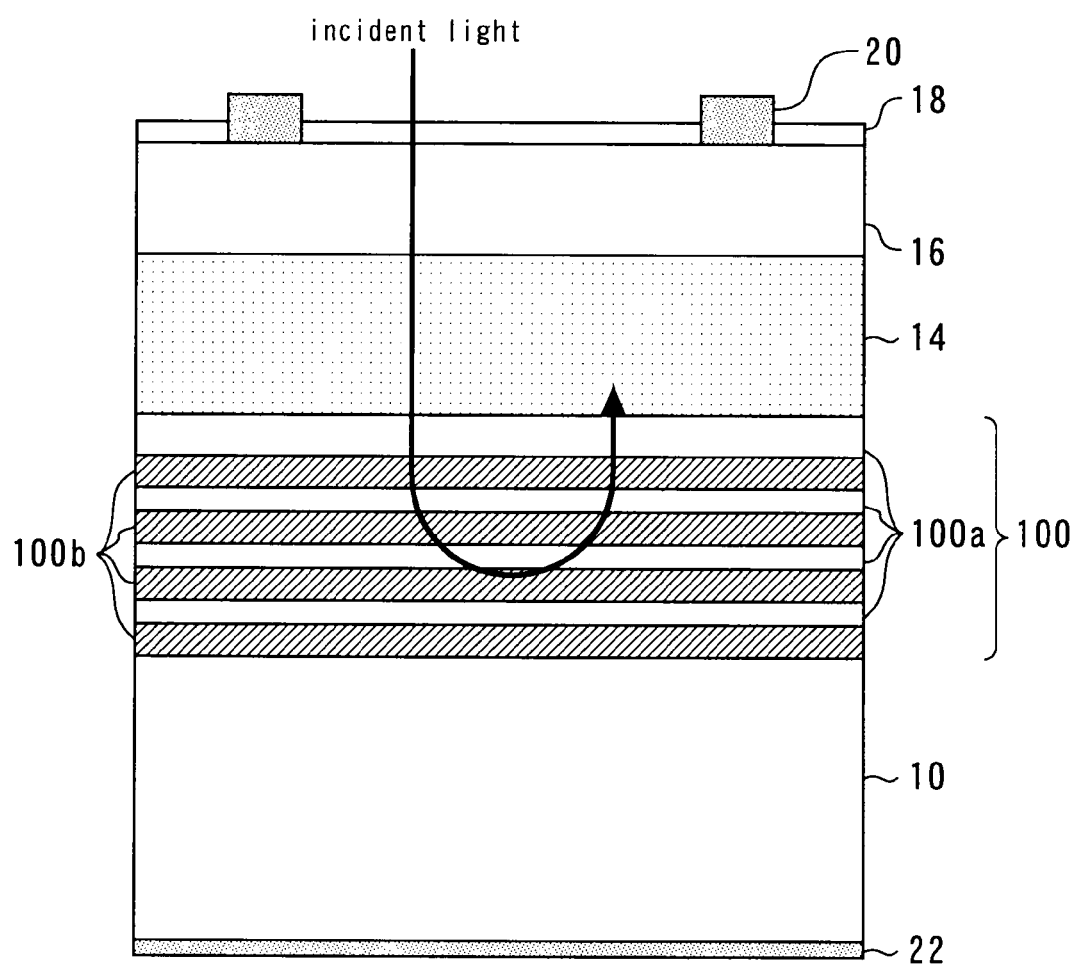
FIG. 2 is a sectional view showing the referent example of an optical semiconductor device.

The effect of the optical semiconductor device according to the present embodiment will be described comparing to a referent example. FIG. 2 is a sectional view showing the referent example of an optical semiconductor device. An n-type DBR layer 100 is composed of alternately laminated n-type InP layers 100a having a different refractive index and n-type InGaAsP layers 100b. Both n-type InP layers 100a and n-type InGaAsP layers 100b have band gap wavelengths smaller than the wavelength λ of incident light, and do not absorb incident light. The optical semiconductor device of the reference example is identical to the optical semiconductor device according to the present embodiment except for the DBR layer.

The n-type DBR layer 100 of the referent example has a maximum reflectance when both the optical layer thickness of each of the n-type InP layers 100a and the optical layer thickness of each of the n-type InGaAsP layers 100b are λ/4. For example, when λ is 1.55 μm and the refractive index of InP is 3.169, the thickness of each n-type InP layer 100a is 0.123 μm; and when the refractive index of InGaAsP is 3.437, the thickness of each n-type InGaAsP layer 100b is 0.113 μm.

Here, the thermal conductivity of InP is about 70 W/m·K, which is about 10 times higher than the thermal conductivity of InGaAs or InGaAsP (about 5 W/m·K). Therefore, in order to elevate the thermal conductivity (=to lower the thermal resistance) of a reflecting layer, the InP layer is thickened, and the InGaAs or InGaAsP layer is thinned. However, in the reference example, when each n-type InGaAsP layer 100b is thinned, the reflectance is lowered. Whereas in the present embodiment, the thickness of the n-type InGaAs layer 12b can be reduced without lowering reflectance. The reason for this will be described below in detail.

Figure 3:
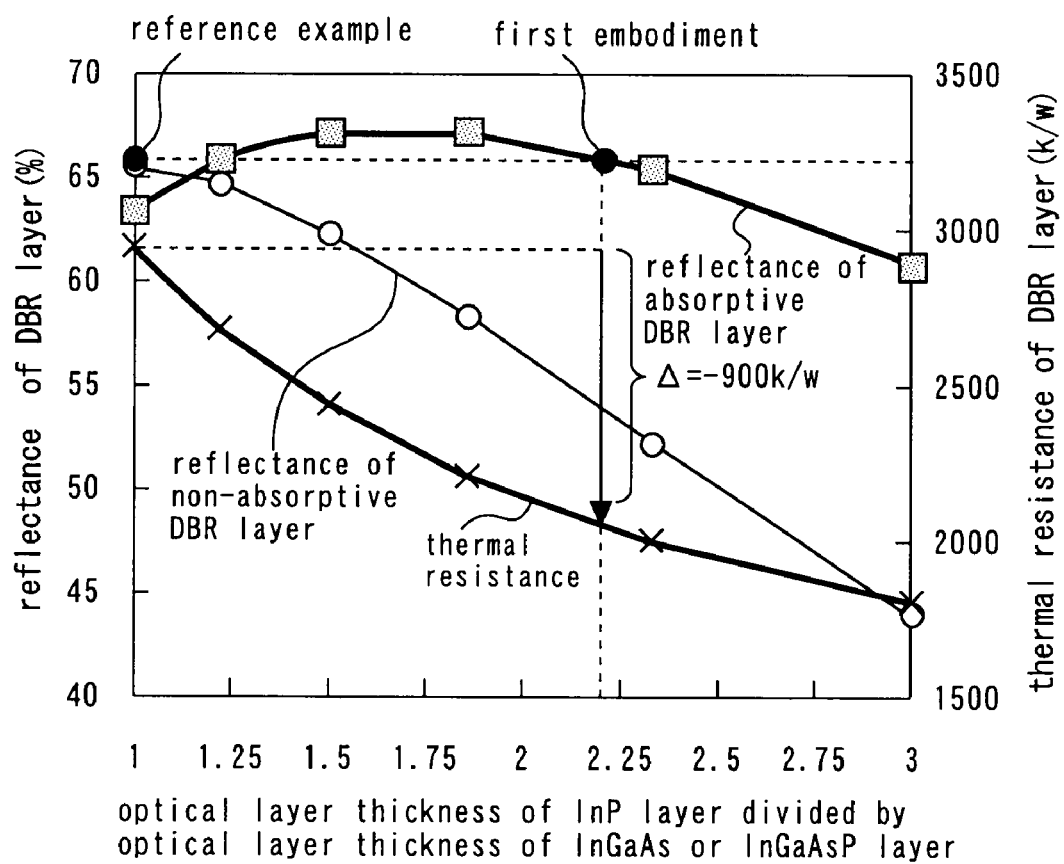
FIG. 3 is a graph showing calculated reflectance and thermal resistance of a DBR layer.

FIG. 3 is a graph showing calculated reflectance and thermal resistance of a DBR layer. The abscissa of FIG. 3 represents "optical layer thickness of InP layer divided by optical layer thickness of InGaAs or InGaAsP layer". Calculation was performed assuming that the wavelength of incident light was 1.55 μm, the band gap wavelength of InGaAsP was 1.4 μm, and light entered into the DBR layer from the InGaAs optical absorption layer. The "absorptive DBR layer" is formed by laminating 13 pairs of InP layers and InGaAs layers, and corresponds to the DBR layer of the present embodiment. On the other hand, the "non-absorptive DBR layer" is formed by laminating 13 pairs of InP layers and InGaAsP layers, and corresponds to the DBR layer of the reference example.

In the non-absorptive DBR layer, the reflectance becomes highest when "optical layer thickness of InP layer divided by optical layer thickness of InGaAsP layer" is 1. On the other hand, in the abosorptive DBR layer, the reflectance becomes highest when "optical layer thickness of InP layer divided by optical layer thickness of InGaAs layer" is about 1.75. Therefore, in the absorptive DBR layer, the InGaAs layer can be made thinner than the InGaAsP layer in the non-absorptive DBR layer while maintaining reflectance in the same degree of the non-absorptive DBR layer. This is because absorption is reduced by thinning the InGaAs layer, which absorbs incident light, and a high reflectance can be obtained, and also because difference in refractive index between InGaAs and InP is larger than that between InGaAsP and InP.

As shown in FIG. 3, in the reference example, "optical layer thickness of InP layer divided by optical layer thickness of InGaAs layer" is 1, and the reflectance is highest. Whereas in the first embodiment, although "optical layer thickness of InP layer divided by optical layer thickness of InGaAs layer" is about 2.2, the reflectance of the same degree to the reference example (=66%) can be achieved. Therefore, since the InGaAs layer is thin, the thermal resistance of the DBR layer can be reduced by as much as 900 K/W from the thermal resistance of the reference example. Therefore, the optical semiconductor device according to the present embodiment has a favorable linearity of response, and high quantum efficiency.

However, not only the above-described value, but if the value of "optical layer thickness of InP layer divided by optical layer thickness of InGaAs layer" is made to be 1.2 to 3 in the configuration of the first embodiment, the thermal resistance of the DBR layer can be reduced while maintaining the reflectance of the DBR layer in the same degree to the reference example.

In place of the n-type InP layers 12a, GaAs layers, S layers, AlInAs layers, InGaAsP layers having a band gap wavelength smaller than the wavelength of incident light, or AlGaInAs layers may also be used. In place of the n-type InGaAs layers 12b, InGaAsP layers having a band gap wavelength larger than the wavelength of incident light, or AlGaInAs layers may also be used.

Second Embodiment

Figure 4:
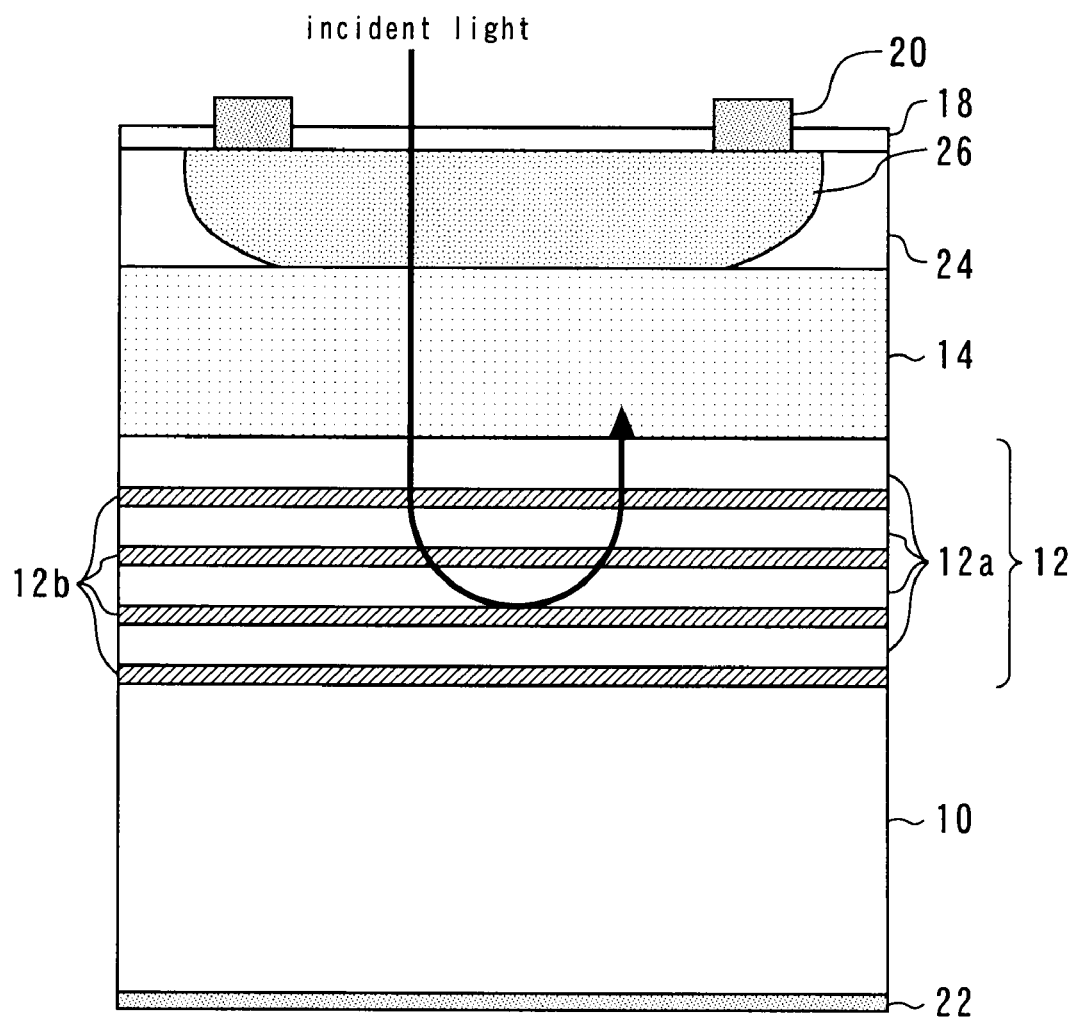
FIG. 4 is a sectional view showing an optical semiconductor device according to a second embodiment of the present invention.

FIG. 4 is a sectional view showing an optical semiconductor device according to a second embodiment of the present invention. The optical semiconductor device is a planar-type pin photodiode on which a p-type area is formed using selective diffusion.

An n-type InP layer 24 having a low carrier concentration is formed on an i-InGaAs optical absorption layer 14, and a p-type InP layer 26 (semiconductor layer of a second conductivity type) is formed on a part of the n-type InP layer 24 using selective diffusion and the like. Other configurations are identical to the configurations of the first embodiment. Thereby the same effect as the effect of the first embodiment can be obtained.

Third Embodiment

Figure 5:
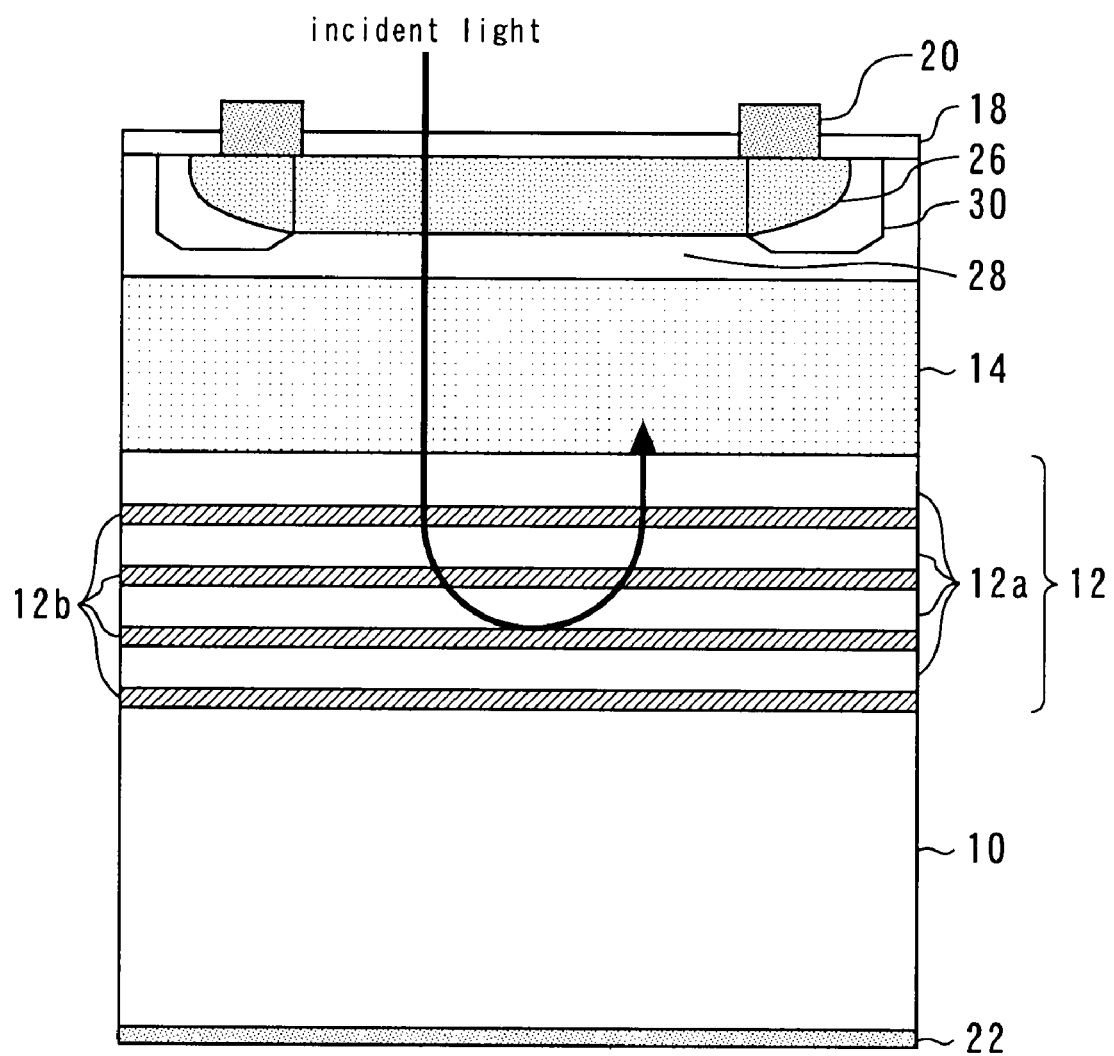
FIG. 5 is a sectional view showing an optical semiconductor device according to a third embodiment of the present invention.

FIG. 5 is a sectional view showing an optical semiconductor device according to a third embodiment of the present invention. The optical semiconductor device is a planar-type InP avalanche photodiode.

An n-type InP multiplication layer 28 (carrier multiplication layer) is formed on an i-InGaAs optical absorption layer 14, and a p-type InP layer 26 (semiconductor layer of a second conductivity type) is formed on a part of the n-type InP multiplication layer 28 using selective diffusion and the like. A guard ring 30 is formed around the p-type InP layer 26 using Be ion implantation and the like. The n-type InP multiplication layer 28 avalanche-multiplies light carriers generated in an i-InGaAs optical absorption layer 14. Other configurations are identical to the configurations of the first embodiment.

Although an avalanche photodiode especially easily causes a space-charge effect, and generates a large quantity of heat because of using at a high voltage, the avalanche photodiode stably operates even in high light input by reducing the thermal resistance of the DBR layer.

Fourth Embodiment

Figure 6:
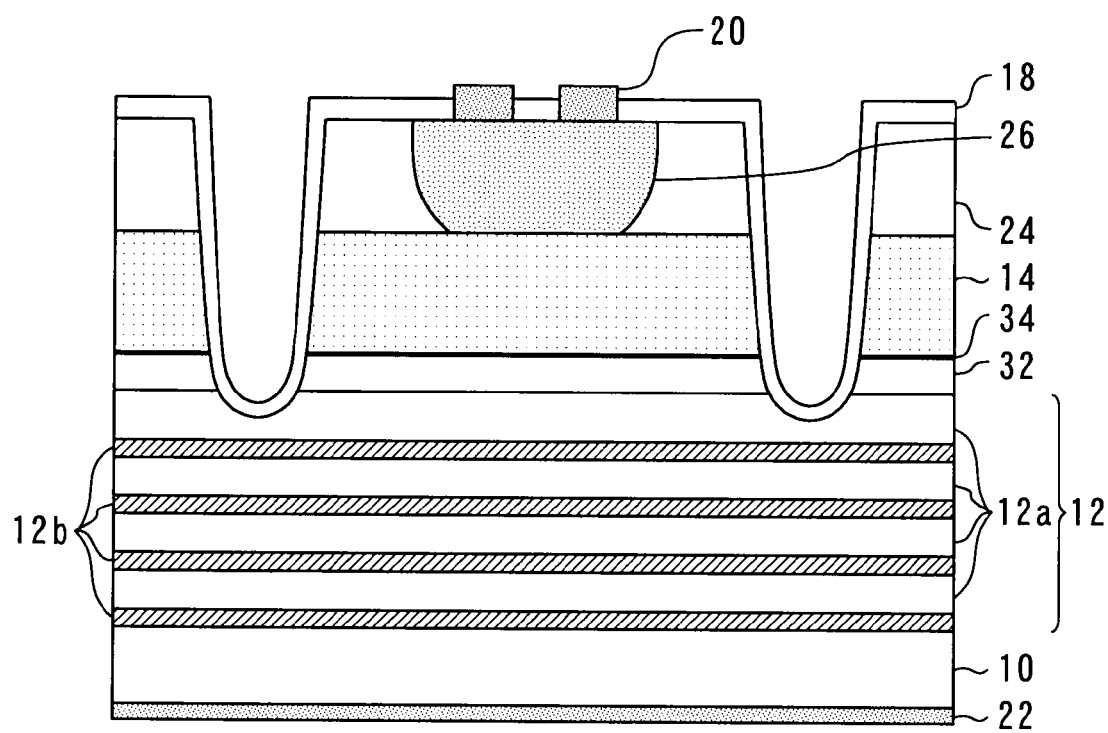
FIG. 6 is a sectional view showing an optical semiconductor device according to a fourth embodiment of the present invention.

FIG. 6 is a sectional view showing an optical semiconductor device according to a fourth embodiment of the present invention. The optical semiconductor device is a planar-type AlInAs avalanche photodiode.

An n-type AlInAs multiplication layer 32 (carrier multiplication layer) and an electric-field relaxing layer 34 are formed between an n-type DBR layer 12 and an i-InGaAs optical absorption layer 14. The n-type AlInAs multiplication layer 32 avalanche-multiplies light carriers generated in an i-InGaAs optical absorption layer 14. Other configurations are identical to the configurations of the second embodiment.

Since n-type InP layers 12a having low thermal resistance are present in the vicinity of the n-type AlInAs multiplication layer 32, which becomes a heat source, heat can be efficiently dissipated. If AlInAs layers having the same refractive index as the n-type AlInAs multiplication layer 32 are used as layers having a low refractive index of an n-type DBR layer 12 in place of n-type InP layers 12a, crystal growth can be stably performed because the same material is used.

Fifth Embodiment

Figure 7:
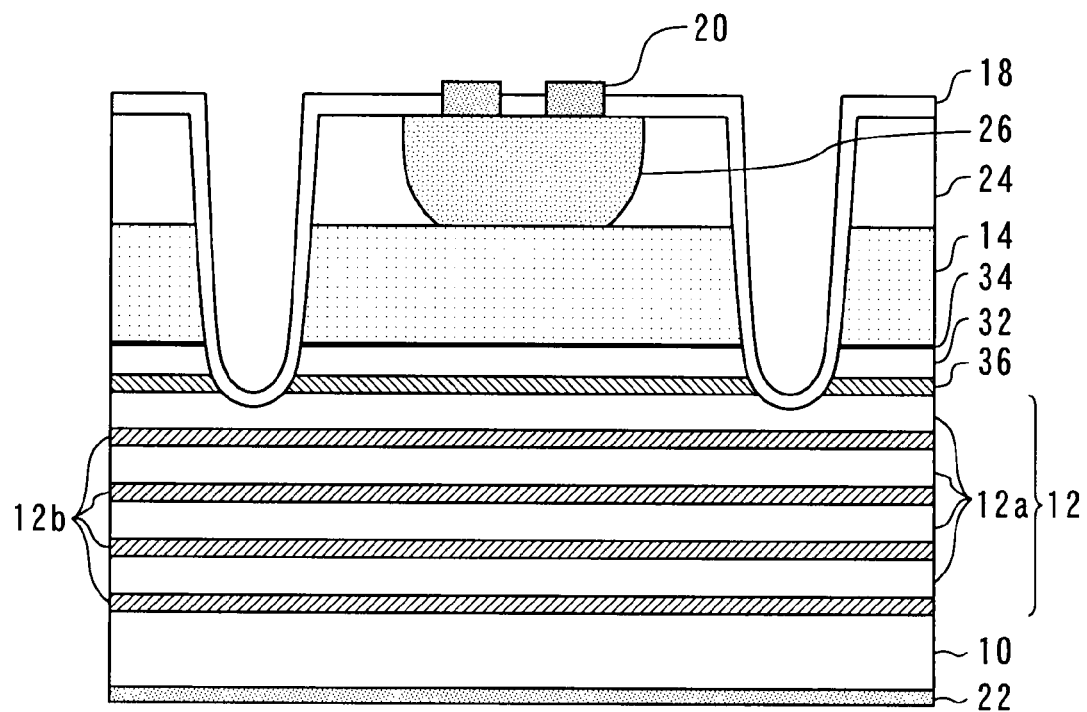
FIG. 7 is a sectional view showing an optical semiconductor device according to a fifth embodiment of the present invention.

FIG. 7 is a sectional view showing an optical semiconductor device according to a fifth embodiment of the present invention. The optical semiconductor device is a planar-type AlInAs avalanche photodiode as in the fourth embodiment.

An n-type AlInAs layer 36 having a high carrier concentration is inserted between the n-type InP layers 12a of an n-type DBR layer 12 and an n-type AlInAs multiplication layer 32. Other configurations are identical to the configurations of the fourth embodiment. Thereby, since the electric field of the n-type AlInAs multiplication layer 32 is not applied to the n-type InP layers 12a, the multiplication of holes in the n-type InP layers 12a is suppressed, and a low-noise avalanche photodiode can be achieved.

Sixth Embodiment

Figure 8:
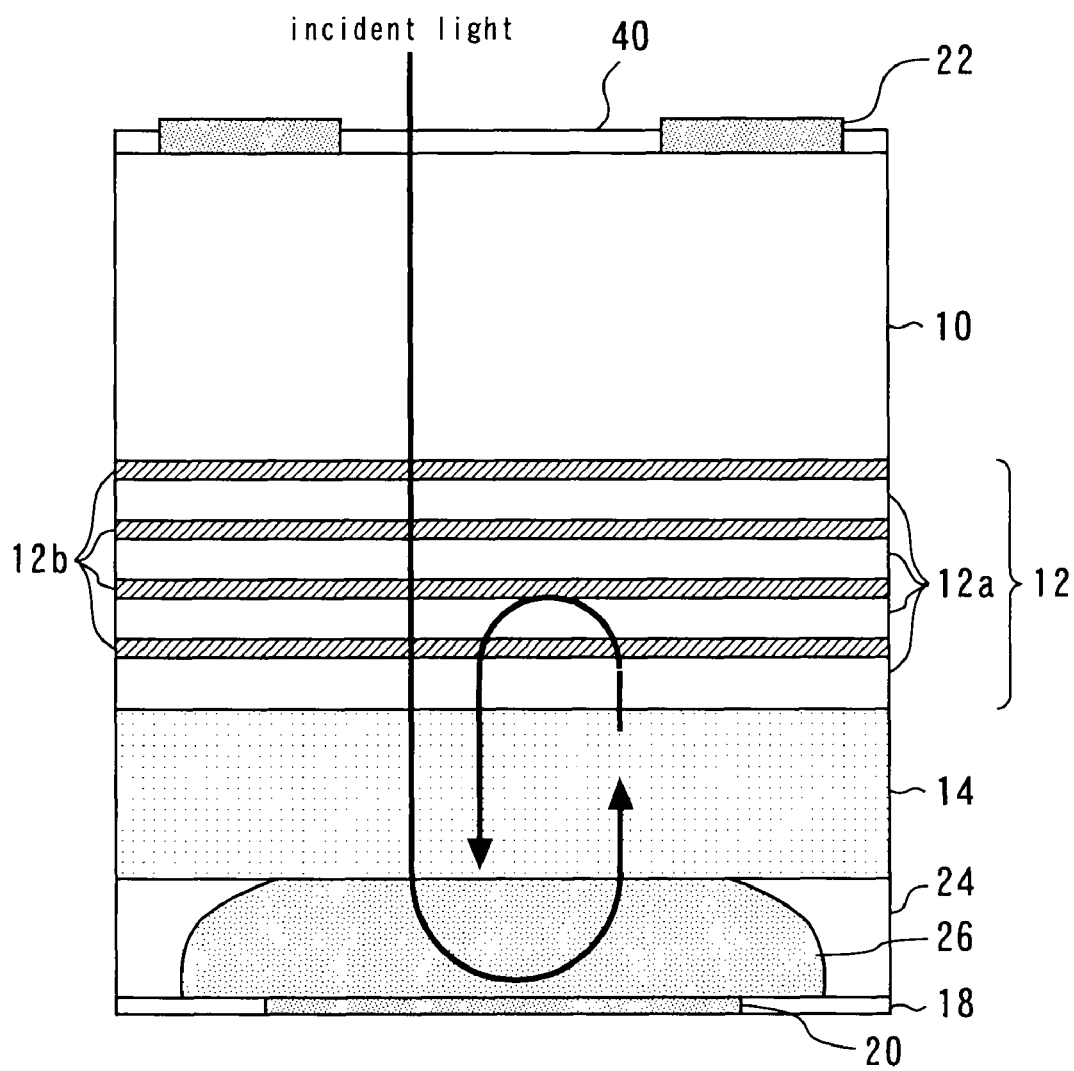
FIG. 8 is a sectional view showing an optical semiconductor device according to a sixth embodiment of the present invention.

FIG. 8 is a sectional view showing an optical semiconductor device according to a sixth embodiment of the present invention. The optical semiconductor device is a lower-surface incident resonance-type photodiode that receives light from the substrate side.

A reflection preventing film 40 is formed on the lower surface of an n-type InP substrate 10, and light enters from the lower surface side of the n-type InP substrate 10. Other configurations are identical to the configurations of the second embodiment.

Although an n-type DBR layer 12 is present in the entering side of light, since n-type InGaAs layers 12b having a high refractive index are thin, the advantage of little loss of incident light can be obtained. In addition, the effects similar to the effects of the first and second embodiments can be obtained.

Seventh Embodiment

Figure 9:
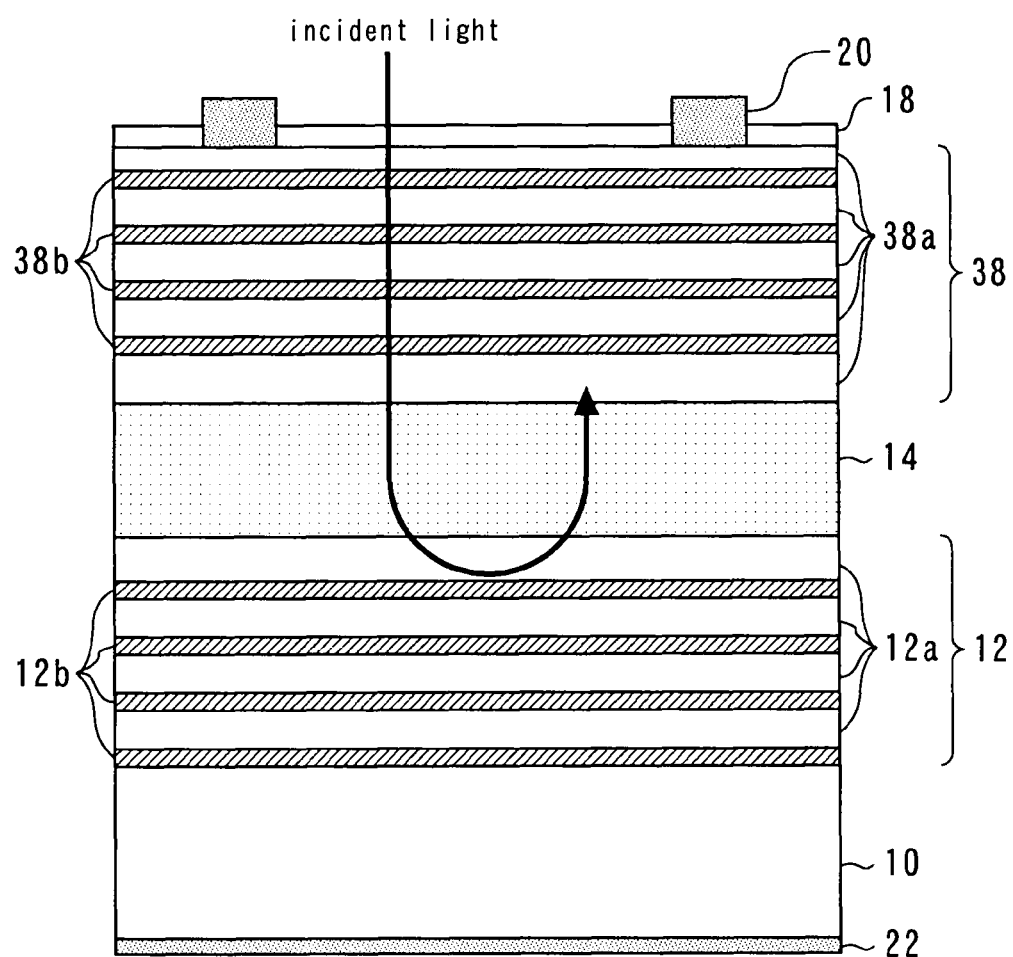
FIG. 9 is a sectional view showing an optical semiconductor device according to a seventh embodiment of the present invention.

FIG. 9 is a sectional view showing an optical semiconductor device according to a seventh embodiment of the present invention. The optical semiconductor device is a resonance-type photodiode.

A p-type DBR layer 38 (distributed Bragg reflector layer of a second conductivity type) is formed in place of the p-type InP window layer 16 in the first embodiment. Other configurations are identical to the configurations of the first embodiment.

The p-type DBR layer 38 is composed of alternately laminated p-type InP layers 38a having a low refractive index (first semiconductor layers) and p-type InGaAs layers 38b having a high refractive index (second semiconductor layers). Each of the p-type InP layers 38a has a band gap wavelength smaller than the wavelength $\lambda$ of incident light, and does not absorb incident light. On the other hand, each of the p-type InGaAs layers 38b has a band gap wavelength larger than the wavelength $\lambda$ of incident light, and absorbs incident light.

The sum of the optical layer thickness of a layer of the p-type InP layers 38a and a layer of the p-type InGaAs layers 38b is half the wavelength λ of incident light (=λ/2). Therefore, the n-type DBR layer 12 efficiently operates as a reflecting layer for the incident light having a wavelength λ.

The optical layer thickness of each of the p-type InP layers 38a is larger than the optical layer thickness of each of the p-type InGaAs layers 38b. Specifically, "optical layer thickness of InP layer divided by optical layer thickness of InGaAs layer" is 1.2 to 3. Since the p-type InGaAs layers 38b having high thermal resistance is thin, the n-type DBR layer 12 favorably dissipates heat.

When the i-InGaAs optical absorption layer 14 is between DBR layers as described above, since light shuffles between the upper and lower DBR layers, high sensitivity can be obtained; however, heat has no space to escape and is trapped in the i-InGaAs optical absorption layer 14. Therefore, by using DBR layers having high heat dissipating ability as described above, the heat dissipating ability of the optical semiconductor device can be improved. Consequently, the optical semiconductor device according to the present embodiment has favorable linearity of response, and high quantum efficiency. Furthermore, since p-type InGaAs layers 38b having a high refractive index are thin, the advantage of little loss of incident light can also be obtained.

Eighth Embodiment

Figure 10:
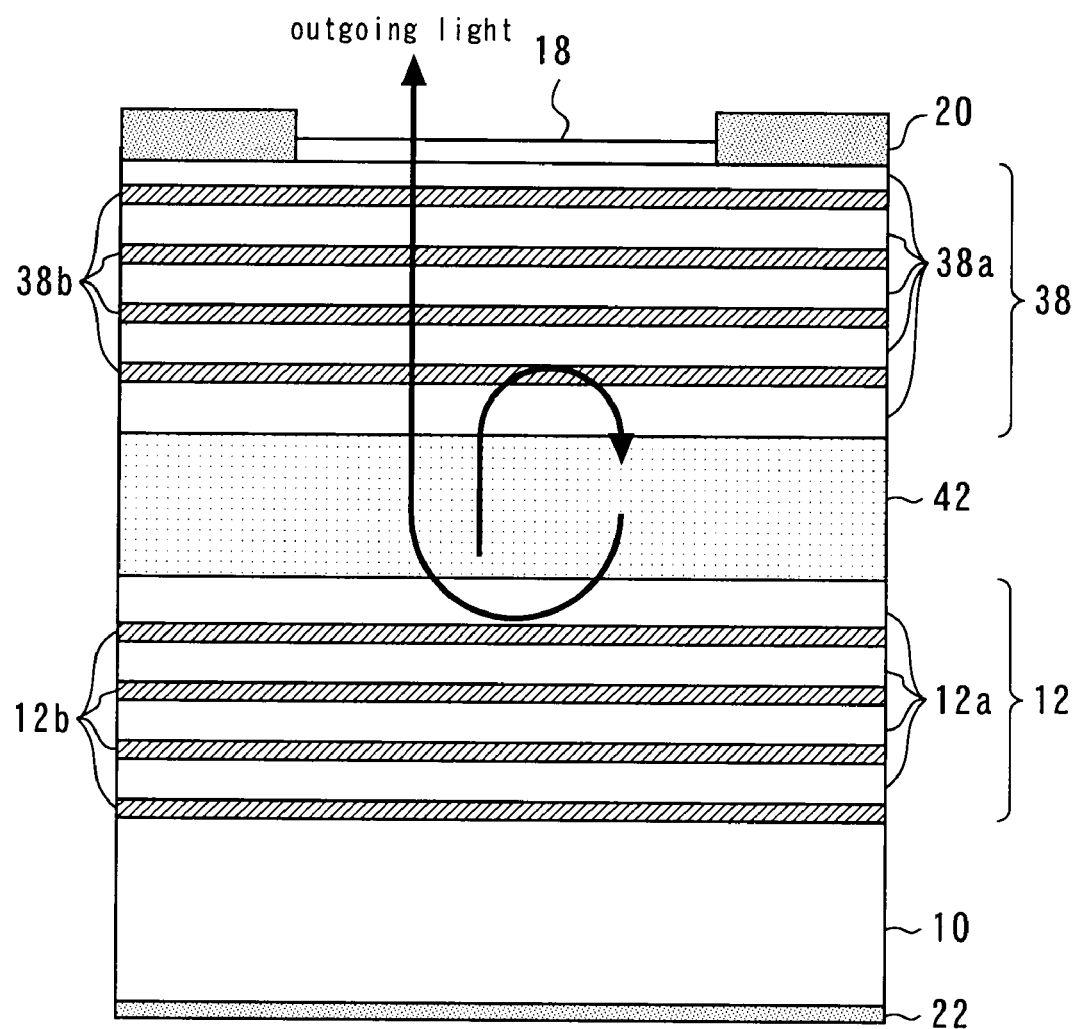
FIG. 10 is a sectional view showing an optical semiconductor device according to an eighth embodiment of the present invention.

FIG. 10 is a sectional view showing an optical semiconductor device according to an eighth embodiment of the present invention. The optical semiconductor device is a surface emitting laser.

On an n-type InP substrate 10 (semiconductor substrate), an n-type DBR layer 12 (distributed Bragg reflector layer of a first conductivity type), an i-InGaAs active layer having a low carrier concentration 42 (active layer), and a p-type DBR layer 38 (distributed Bragg reflector layer of a second conductivity type) are sequentially formed. On the p-type DBR layer 38, an insulating film 18 composed of SiN or the like combining a reflection preventing film and a surface protecting layer, and an anode (p-type) 20 are formed. On the lower surface of the n-type InP substrate 10, a cathode (n-type) 22 is formed.

The n-type DBR layer 12 is composed of alternately laminated n-type InP layers 12a having a low refractive index (first semiconductor layers) and n-type InGaAs layers 12b having a high refractive index (second semiconductor layers). The p-type DBR layer 38 is composed of alternately laminated p-type InP layers 38a having a low refractive index (first semiconductor layers) and p-type InGaAs layers 38b having a high refractive index (second semiconductor layers). Each of the n-type InP layers 12a and p-type InP layers 38a has a band gap wavelength smaller than the wavelength λ of outgoing light, and does not absorb outgoing light. On the other hand, each of the n-type InGaAs layers 12b and the p-type InGaAs layers 38b has a band gap wavelength larger than the wavelength λ of outgoing light, and absorbs outgoing light.

The sum of the optical layer thickness of each of the n-type InP layers 12a and the optical layer thickness of each of the n-type InGaAs layers 12b is half the wavelength λ of outgoing light; and the sum of the optical layer thickness of a layer of the p-type InP layers 38a and a layer of the p-type InGaAs layers 38b is half the wavelength λ of outgoing light. Therefore, the n-type DBR layer 12 and the p-type DBR layer 38 efficiently operate as reflecting layers for the incident light having a wavelength of λ.

The optical layer thickness of each of the n-type InP layers 12a is larger than the optical layer thickness of each of the n-type InGaAs layers 12b, and the optical layer thickness of each of the p-type InP layers 38a is larger than the optical layer thickness of each of the p-type InGaAs layers 38b. Specifically, "optical layer thickness of InP layer divided by optical layer thickness of InGaAs layer" is 1.2 to 3. Since the n-type InGaAs layers 12b and the p-type InGaAs layers 38b having high thermal resistance are thin, the n-type DBR layer 12 and the p-type DBR layer 38 favorably dissipate heat.

When the i-InGaAs active layer 42 is between DBR layers as described above, light shuffles between the upper and lower DBR layers, i.e. laser oscillation occurs; however, heat has no space to escape and is trapped in the i-InGaAs active layer 42. Therefore, by using DBR layers having high heat dissipating ability as described above, the heat dissipating ability of the optical semiconductor device can be improved. Consequently, the optical semiconductor device according to the present embodiment has favorable linearity of response, and high quantum efficiency. Furthermore, since p-type InGaAs layers 38b having a high refractive index are thin, the advantage of little loss of outgoing light can also be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-136918, filed on May 26, 2008 including specification, claims, drawings and summary, on which the Convention priority of the present application is based, are incorporated herein by reference in its entirety.

What is claimed is:

1. An optical semiconductor device comprising:
    a distributed Bragg reflector layer of a first conductivity type including
        at least one first semiconductor layer having a first physical thickness and formed from a first material having a first band gap wavelength, and
        at least one second semiconductor layer having a second physical thickness and formed from a second material having a second band gap wavelength;
    an optical absorption layer; and
    a semiconductor layer of a second conductivity type, sequentially formed on a semiconductor substrate, wherein
    a given incident vacuum wavelength is intermediate between the first and second band gap wavelength,
    at said incident vacuum wavelength, the first material has a first refractive index and the first semiconductor layer has a first optical layer thickness equal to the product of the first physical thickness multiplied by the first refractive index divided by the incident vacuum wavelength,
    at said incident vacuum wavelength, the second material has a second refractive index and the second semiconductor layer has a second optical layer thickness equal to the product of second physical thickness multiplied by the second refractive index divided by the incident vacuum wavelength, and
    the second band gap wavelength is larger than the first band gap wavelength, the second refractive index is higher than the first refractive index, and the first optical layer thickness is larger than the second optical layer thickness.

2. The optical semiconductor device according to claim 1, wherein a sum of the optical layer thickness of each of said first semiconductor layers and the optical layer thickness of each of said second semiconductor layers is half the incident vacuum wavelength.

3. The optical semiconductor device according to claim 1, wherein the value of the first optical layer thickness of each of said first semiconductor layers divided by the second optical layer thickness of each of said second semiconductor layers is 1.2 to 3.

4. The optical semiconductor device according to claim 1, wherein a carrier multiplication layer that avalanche-multiplies photocarriers generated in said optical absorption layer is formed between said optical absorption layer and said semiconductor layer of the second conductivity type.

5. The optical semiconductor device according to claim 1, wherein a carrier multiplication layer that avalanche-multiplies photocarriers generated in said optical absorption layer is formed between said distributed Bragg reflector layer of the first conductivity type and said optical absorption layer.

6. The optical semiconductor device according to claim 1, wherein light is incident from the lower surface side of said semiconductor substrate.

7. An optical semiconductor device comprising:
a distributed Bragg reflector layer of a first conductivity type;
an optical absorption layer; and
a distributed Bragg reflector layer of a second conductivity type, sequentially formed on a semiconductor substrate; wherein
the distributed Bragg reflector layer of the first conductivity type and the distributed Bragg reflector layer of the second conductivity type each include
at least one first semiconductor layer having a first physical thickness and formed from a first material having a first band gap wavelength, and
at least one second semiconductor layer having a second physical thickness and formed from a second material having a second band gap wavelength;
a given incident vacuum wavelength is intermediate between the first and second band gap wavelength,
at said incident vacuum wavelength, the first material has a first refractive index and the first semiconductor layer has a first optical layer thickness equal to the product of the first physical thickness multiplied by the first refractive index divided by the incident vacuum wavelength,
at said incident vacuum wavelength, the second material has a second refractive index and the second semiconductor layer has a second optical layer thickness equal to the product of second physical thickness multiplied by the second refractive index divided by the incident vacuum wavelength, and
the second band gap wavelength is larger than the first band gap wavelength, the second refractive index is higher than the first refractive index, and the first optical layer thickness is larger than the second optical layer thickness.

8. An optical semiconductor device comprising:
a distributed Bragg reflector layer of a first conductivity type;
an active layer; and
a distributed Bragg reflector layer of a second conductivity type, sequentially formed on a semiconductor substrate, wherein
the distributed Bragg reflector layer of the first conductivity type and the distributed Bragg reflector layer of the second conductivity type each include
at least one first semiconductor layer having a first physical thickness and formed from a first material having a first band gap wavelength, and
at least one second semiconductor layer having a second physical thickness and formed from a second material having a second band gap wavelength;
a given incident vacuum wavelength is intermediate between the first and second band gap wavelength,
at said incident vacuum wavelength, the first material has a first refractive index and the first semiconductor layer has a first optical layer thickness equal to the product of the first physical thickness multiplied by the first refractive index divided by the incident vacuum wavelength,
at said incident vacuum wavelength, the second material has a second refractive index and the second semiconductor layer has a second optical layer thickness equal to the product of second physical thickness multiplied by the second refractive index divided by the incident vacuum wavelength, and
the second band gap wavelength is larger than the first band gap wavelength, the second refractive index is higher than the first refractive index, and the first optical layer thickness is larger than the second optical layer thickness.

\* \* \* \* \*